Nov. 17, 1959 J. A. CUNNINGHAM ET AL 2,913,600
DIODE AMPLIFIER AND COMPUTER CIRCUITRY
Filed Feb. 11, 1958 2 Sheets-Sheet 1

TRANSFER STAGE UTILIZING HOLE STORAGE & TRANSISTOR ACTION

Inventors
James A. Cunningham
Arthur W. Holt
By Arthur Vinograd
Attorney

INVENTORS.
James A. Cunningham
Arthur W. Holt
BY Arthur Vinograd ATTORNEY

United States Patent Office 2,913,600

Patented Nov. 17, 1959

2,913,600

DIODE AMPLIFIER AND COMPUTER CIRCUITRY

James A. Cunningham, Wheaton, and Arthur W. Holt, Silver Spring, Md., assignors to the United States of America as represented by the Secretary of Commerce Application February 11, 1958, Serial No. 714,663

3 Claims. (Cl. 307—88.5)

This invention relates to an improvement in diode amplifier circuits, and particularly contemplates circuits employing the singular characteristics of diode amplifiers for counting and computer operations. Various modifications of bistable or flip-flop circuits and transfer stages characterized by a minimum number of circuit components are provided in accordance with the principles of the present invention.

The characteristics whereby certain semiconductor diodes have the singular ability to produce amplification is fully discussed in one of the applicant's copending applications, Serial No. 455,097 filed on September 9, 1954, now U.S. Patent No. 2,879,409, which is assigned to the assignee in the present case.

As described in such copending application, because of the reverse transient response characteristics of certain types of semiconductor diodes, a diode does not immediately become non-conducting when its condition of bias is switched from a forward conducting to a back voltage condition. During the latter condition, back currents of comparatively large magnitude can be obtained for an appreciable time interval following the application of a back E.M.F. to the cathode of the diode.

Briefly, the static properties of the semiconductor diode are characterized by high conductivity when voltage is applied in a "forward" direction and low conductivity when voltage is applied in a "reverse" direction as is well known. The "forward" voltage apparently helps electrons and holes to diffuse freely across each other between p- and n-type semiconductors into the outer region where they become minority carriers. The resulting high concentration of carriers throughout the semiconductors provides high conductivity. The reverse voltage, on the other hand, draws the carriers away from the junction toward their own regions, leaving a layer at the junction which is quite depleted of carriers and has low conductivity.

However, as described in the referred-to copending application, if the voltage applied to the diode is switched quickly from a forward to a reverse conducting state, a reverse transient response phenomenon occurs in which a large reverse current is obtainable through the diode for an appreciable length of time after the reverse voltage has been established. This large current decays approximately exponentially until the static reverse current is reached. Such large transient reverse current occurs because the carriers which are present due to the forward voltage remain available to be swept out by the application of the reverse voltage. The carriers do not remain available indefinitely during the delay period between cessation of forward driving voltage and application of reverse voltage, but instead their number decreases as a function of time during such period.

As is further explained in the copending application, the manner in which amplification is obtained in a diode is closely related to the manner in which amplification is obtained in a transistor. The emitter of a transistor can be considered as the equivalent of a diode which is biased in a forward direction, and a collector can similarly be considered as a diode biased in a reverse direction. If minority carriers diffuse from the forward biased diode to the vicinity of the reverse diode, they will be swept across the junction and thus augment the scattered reverse current. Power is gained because carriers introduced by a low voltage at the emmitter are collected at a much higher voltage at the collector anode.

The diode amplifier obtains its power gain in a very similar manner except that one electrode serves as both an emitter and collector. If the electrodes of the diode are biased by a clock pulse source as described in the copending application, during one-half of the cycle the anode is more positive than the cathode and therefore acts as the emitter of a transistor; during the other half-cycle in which the anode is more negative than the cathode the anode acts as the collector of a transistor. While it is acting as an emitter, the anode is able to inject carriers into the semiconductor with only a small applied forward voltage; that is, at a low impedance level. While it is acting as a collector the anode is able to withdraw those same carriers at a much higher voltage; that is, at a higher impedance level. For a more detailed explanation of the manner in which the semiconductor diode can act as an amplifier, attention is directed to the disclosure in the above-identified copending application. Various circuit embodiments employing the amplification characteristics of a semiconductor diode are described in the copending application. The present invention is directed to circuit modifications which employ the amplification characteristics of a semiconductor diode in connection with pulse circuitry such as can be employed in connection with high-speed digital computers The present invention employs a diode amplifier type of flip-flop stage in association with a transistor transfer stage to achieve a shifting register characterized by simplicity of construction and a high degree of reliability.

It is accordingly an immediate object of the present invention to provide a register circuit employing the characteristic of a diode amplifier in a flip-flop circuit in combination with a transistor transfer stage.

A further object of the present invention is to provide a shifting register which may be constructed out of diodes and transistors.

Another object of the present invention is to provide a shifting register which is simple in construction and has a high degree of reliability.

Other uses and advantages of the invention will become apparent upon reference to the specification and drawings in which.

Figure 1A:
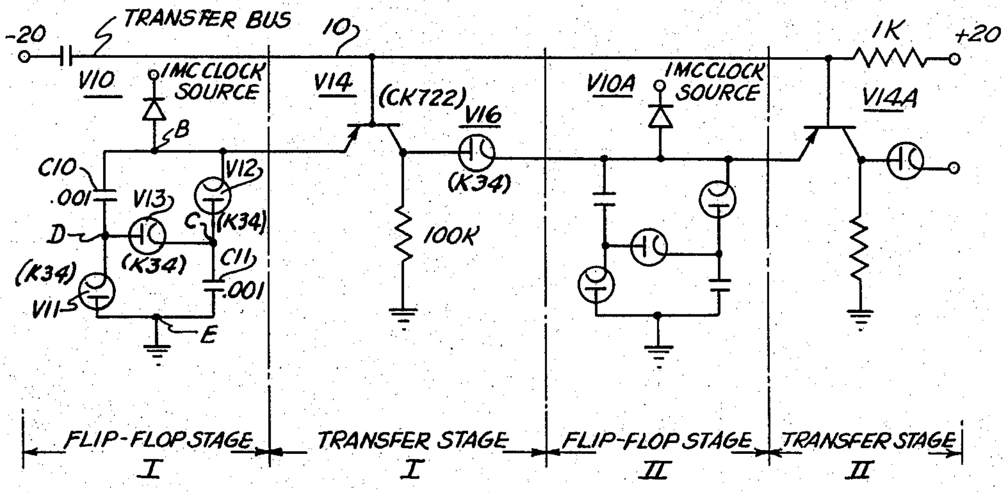
Fig. 1A shows one form of a register constructed in accordance with the principles of the present invention.

A common instrumentality employed in computer circuits is a shifting register. As is well known, shifting registers necessarily require means for transferring the state of one flip-flop to another. Moreover, if all the flip-flop circuits in a chain are to be transferred simultaneously, a short memory between flip-flop stages is also necessary. Fig. 1A shows a diode amplifier transfer circuit having the necessary requisites. A short memory is obtained by utilizing minority carrier storage in a transistor.

In Fig. 1A each of the flip-flop stages I and II is a current-doubler type of flip-flop circuit such as is fully described in connection with Fig. 16 of the copending application. The diodes V10, V10A are employed as diode amplifiers in the manner described in such application. The two-parallel circuit paths B—D—E and B—C—E in each stage including diodes V11, V12 and capacitors C10, C11 comprise an energy storing circuit as described in the referred-to application. Terminal B is connected to the anode of diode amplifier V10 and diode V13 joins points D and C of each referred-to path. When terminal B is high with respect to E, diode V12 is cut off and capacitors C10, C11 will be charged in series by current flow through path B—D—C—E. When terminal B is low with respect to E V11 and V12 will conduct while diode V13 will be cut off and capacitors C10, C11 will discharge in parallel through paths B—D—E and B—C—E, respectively. Current doubling is thereby achieved and is used for injecting carriers into diode amplifier V10. A flip-flop circuit is thereby achieved as described in the copending application.

Each flip-flop stage is connected to a switching voltage such as a 1 mc. clock source as indicated. The clock pulse source provides a switching voltage which is applied to the cathodes of diodes V10 and V10A.

Each flip-flop stage is connected to a transfer stage comprising a transistor such as V14, V14A. The emitter of the transistor is connected to the flip-flop stage, while the base is connected to a source of negative transfer pulses represented by transfer bus 10. The collector of the transistor is connected to a subsequent flip-flop register stage by a buffer diode such as V16.

The transfer circuit shown in Fig. 1A utilizes minority carrier storage in the transistor for the short memory. Considering the circuit of Fig. 1A of a preceding flip-flop as in an "on" state, when a negative transfer pulse is fed to the base of transistor V14 through transfer bus 10, the energy stored either in the diode amplifier V10 or in the capacitors C10, C11 is re-routed into the emitter circuit of the transfer transistor V14 thereby injecting holes into the base of such transistor.

When such negative transfer pulse is removed, the base of the transistor returns to a condition of positive bias potential. If carriers have been injected into the base region, they are then swept out through the circuit including the collector electrode of transistor V14 thereby injecting a charge into the flip-flop of the next subsequent stage (stage II) thus turning it to an "on" state.

The transfer pulse employed must be wider (on a time base) than one clock pulse cycle. The impedance of the transfer pulse source should be low enough to re-route the charge in the flip-flop. If such conditions are met, the transfer pulse need not be synchronized with the switching voltage applied to the cathode terminal of V10. The buffer diodes V16, V16A in each stage are used to isolate each register stage.

Figure 1B:
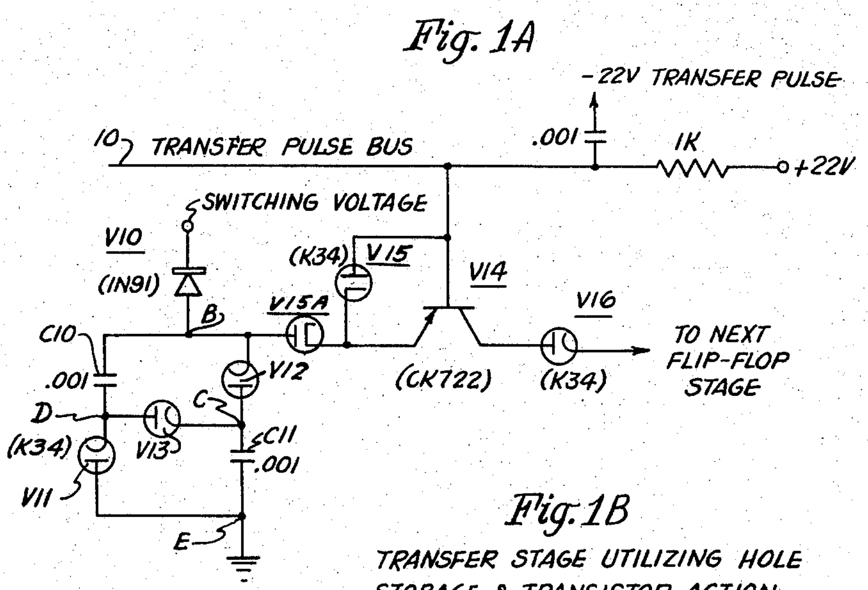
Fig. 1B is a modification of Fig. 1A in which both hole storage and transistor action is used in the transfer stage.

Fig. 1B shows a transfer stage similar to Fig. 1A and utilizing both hole storage and transistor action. The circuit of Fig. 1B is essentially the same as Fig. 1A but includes an additional diode V15 connected between the base and emitter electrodes of the transfer transistor and a diode V15A. Such diodes have the effect of increasing the magnitude of the charge transfer. That is, the base resistance of the transistor is employed to inject additional carriers in the transfer circuit.

Figure 2:
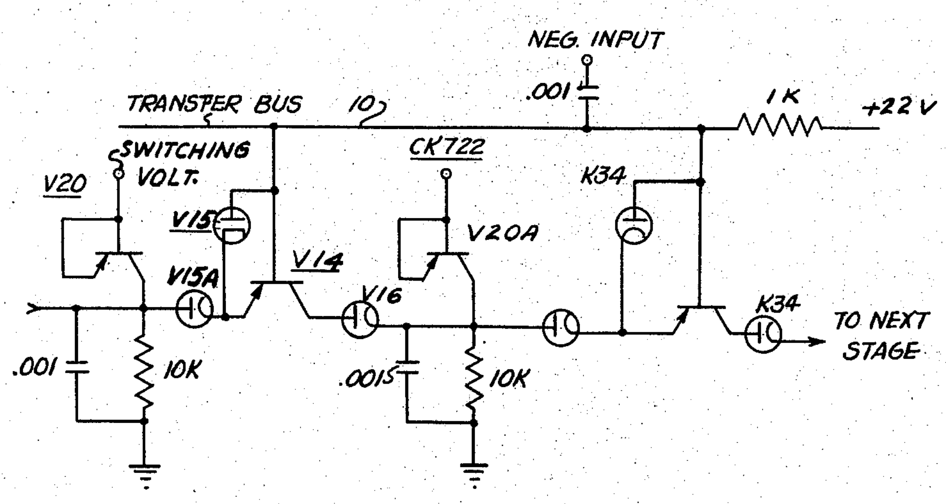
Fig. 2 is a further modification showing transistor employed in both the flip-flop and transfer stages.

Fig. 2 shows two stages of a modified register similar to Fig. 1B in which a transistor V20 having its emitter tied to the base is employed as the diode amplifier. The circuit otherwise functions in the manner of Fig. 1B.

It will be apparent that the embodiments shown are only exemplary and that various modifications can be made in construction and arrangement within the scope of invention as defined in the appended claims.

What is claimed is:

1. A shift register comprising a plurality of stages in which each stage includes a flip-flop stage and associated transfer stage, said flip-flop stage comprising a semiconductor diode having a characteristic reverse transient response period in which the reverse impedance following a forward conducting state remains low for a discernible period, a pulse source providing power pulses of alternating polarity, means connecting said power pulses to the cathode-connected terminal of said semiconductor diode to periodically bias said diode in synchronism with said power pulse source to a reverse conducting state in which said cathode is positive with respect to the anode-connected terminal of said diode, said power pulses having a duration commensurate with said defined reverse transient response period, an energy storage circuit connected to said anode-connected terminal of said diode comprising a plurality of charge-storing devices, means for charging said storing devices in series during an applied pulse from said source rendering said anode-connected terminal positive with respect to said cathode-connected terminal, means for discharging said storing devices in parallel during an applied pulse from said source of opposite polarity, said transfer stage comprising a transistor having an emitter connected to the anode-connected terminal in said flip-flop stage, a source of transfer pulses, and means connecting said transfer pulse source to the base of said transistor.

2. The invention of claim 1 including a buffer diode connecting the collector of the transistor in a preceding transfer stage to the flip-flop stage of a subsequent stage of said register.

3. The invention of claim 2 including a diode connecting the base and emitter electrodes of said transfer stage transistor.

References Cited in the file of this patent

UNITED STATES PATENTS

| | | |
|---|---|---|
| 2,601,089 | Burkhart | June 17, 1952 |
| 2,638,542 | Fleming | May 12, 1953 |
| 2,705,287 | Lo | Mar. 29, 1955 |

OTHER REFERENCES

N.B.S. Technical News Bulletin, vol 38, No. 10, October 1954, "Diode Amplifier," pages 145 to 148.

The Proceedings of the Institution of Electrical Engineers, vol. 101, part III, No. 73, October 1954, "The Transistor Regenerative Amplifier as a Computer Element" by G. B. B. Chaplin, pages 298 to 307 (pages 302 and 303 relied on).

The Institution of Electrical Engineers Journal, September 1957, pp. 509 and 510.